US009323876B1

(12) United States Patent
Lysaght et al.

(10) Patent No.: US 9,323,876 B1

(45) Date of Patent: Apr. 26, 2016

(54) INTEGRATED CIRCUIT PRE-BOOT METADATA TRANSFER

(71) Applicant: Xilinx, Inc., San Jose, CA (US)

(72) Inventors: Patrick Lysaght, Los Gatos, CA (US); Yi-Hua E. Yang, San Jose, CA (US); Paul R. Schumacher, Berthoud, CO (US); Graham F. Schelle, Longmont, CO (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 14/552,321

(22) Filed: Nov. 24, 2014

(51) Int. Cl.
*G06F 17/50* (2006.01)
*G06F 9/445* (2006.01)

(52) U.S. Cl.
CPC .............. *G06F 17/5045* (2013.01); *G06F 8/65* (2013.01)

(58) Field of Classification Search
CPC ............ G06F 17/5022; G06F 17/5027; G06F 17/5054; G06F 2217/86; G06F 13/22; G06F 13/4291; G06F 15/7867; G06F 15/7864; G06F 17/5031; G06F 1/24; G06F 2213/0038; G06F 2217/84; H03K 19/1776
USPC .................................................. 716/100–106
See application file for complete search history.

(56) References Cited

U.S. PATENT DOCUMENTS 7,219,325 B1 5/2007 Lysaght
7,711,933 B1 5/2010 Lysaght
7,813,912 B1 * 10/2010 Sundararajan .................. 703/22
8,415,974 B1 4/2013 Lysaght
8,751,997 B1 * 6/2014 Gupta ........................... 716/134
8,769,450 B1 * 7/2014 Tian et al. ..................... 716/103

* cited by examiner

*Primary Examiner* — Binh Tat
(74) *Attorney, Agent, or Firm* — Kevin T. Cuenot

(57) ABSTRACT

Pre-boot metadata transfer may include loading a first configuration bitstream into a programmable integrated circuit (IC), wherein the first configuration bitstream includes a first circuit design and metadata for a second circuit design. The metadata may be stored within a memory of the programmable IC. A configuration bitstream load condition may be detected and, responsive to the configuration bitstream load condition, a second configuration bitstream may be loaded into the programmable IC. The second configuration bitstream includes a second circuit design.

20 Claims, 5 Drawing Sheets

100
102
INT 111
CLE 112
103
DSPL 114
or
BRL 113
106
104
IOL 115
CONFIG / CLOCK DISTRIBUTION 109
MGTs 101
CLBs 102
BRAMs 103
IOBs 104
DSPs 106
PROC 110
CONFIG / CLOCKS 105
I/O 107
OTHER 108

INTEGRATED CIRCUIT PRE-BOOT METADATA TRANSFER

FIELD OF THE INVENTION

This disclosure relates to transferring metadata, relating to a circuit design, to an integrated circuit and making the metadata available for use.

BACKGROUND

Integrated circuits (ICs) can be implemented to perform a variety of functions. Some ICs can be programmed to perform specified functions. One example of an IC that can be programmed is a field programmable gate array (FPGA). An FPGA typically includes an array of programmable tiles. These programmable tiles may include, for example, input/output blocks (IOBs), configurable logic blocks (CLBs), dedicated random access memory blocks (BRAM), multipliers, digital signal processing blocks (DSPs), processors, clock managers, delay lock loops (DLLs), and so forth.

Each programmable tile typically includes both programmable interconnect circuitry and programmable logic circuitry. The programmable interconnect circuitry typically includes a large number of interconnect lines of varying lengths interconnected by programmable interconnect points (PIPs). The programmable logic circuitry implements the logic of a user design using programmable elements that may include, for example, function generators, registers, arithmetic logic, and so forth.

The programmable interconnect and programmable logic circuitries are typically programmed by loading a stream of configuration data into internal configuration memory cells that define how the programmable elements are configured. The configuration data can be read from memory (e.g., from an external programmable read-only memory or "PROM") or written into the FPGA by an external device. The collective states of the individual memory cells then determine the function of the FPGA.

Another type of programmable IC is the complex programmable logic device, or CPLD. A CPLD includes two or more "function blocks" connected together and to input/output (I/O) resources by an interconnect switch matrix. Each function block of the CPLD includes a two-level AND/OR structure similar to those used in programmable logic arrays (PLAs) and programmable array logic (PAL) devices. In CPLDs, configuration data is typically stored on-chip in non-volatile memory. In some CPLDs, configuration data is stored on-chip in non-volatile memory, then downloaded to volatile memory as part of an initial configuration (programming) sequence.

For all of these programmable ICs, the functionality of the device is controlled by data bits provided to the device for that purpose. The data bits may be stored in volatile memory (e.g., static memory cells, as in FPGAs and some CPLDs), in non-volatile memory (e.g., FLASH memory, as in some CPLDs), or in any other type of memory cell.

Other programmable ICs are programmed by applying a processing layer, such as a metal layer, that programmably interconnects the various elements on the device. These programmable ICs are known as mask programmable devices. Programmable ICs may also be implemented in other ways, e.g., using fuse or antifuse technology. The phrase "programmable IC" may include, but is not limited to, these devices and further may encompass devices that are only partially programmable. For example, one type of programmable IC includes a combination of hard-coded transistor logic and a programmable switch fabric that programmably interconnects the hard-coded transistor logic.

Other varieties of programmable ICs may include programmable circuitry in which a circuit design may be implemented responsive to loading a stream of configuration data in combination with one or more other circuits and/or systems. An application specific integrated circuit (ASIC), for example, may include programmable circuitry. In another example, a system-on-chip (SOC) may include programmable circuitry.

An SOC is an IC that includes a plurality of different subsystems. The subsystems are included within a single chip substrate. The subsystems of the SOC are integrated to work cooperatively with one another. One example of an SOC is a chip level implementation of a computer or other data processing system. For example, the SOC may include a processor that executes program code such as an operating system and/or one or more applications. The processor operates cooperatively with one or more of the other on-chip subsystems. The other subsystems may be digital circuits, analog circuits, mixed-signal circuits, or the like. Exemplary subsystems that may be included within an SOC and operate cooperatively with a processor may include, but are not limited to, wireless transceivers, signal processors, CODECs, memory, memory controllers, I/O peripherals, and the like. One or more of the subsystems may be implemented in the SOC within programmable circuitry.

As may be observed from the foregoing discussion, programmable ICs may be highly complex. The capacity of modern programmable ICs is often so large that the circuit design implemented within the programmable IC is the result of work from a team of circuit designers as opposed to a single individual working alone. Once the programmable IC is released into the field with a circuit design implemented therein, the ability of one to learn about the particular elements of the circuit design within the programmable IC is significantly limited or non-existent.

If, for example, the programmable IC requires troubleshooting or other maintenance, the individual, or individuals, performing the troubleshooting are unlikely to be the original circuit designers. Much of the design information available within an electronic design automation tool used by the original circuit designers, for example, is not available to the persons conducting the troubleshooting. In consequence, the personnel conducting troubleshooting may not know, and have no way of ascertaining, the implementation details of the circuit design within the programmable IC. The implementation details, however, may be necessary for troubleshooting the programmable IC or troubleshooting the larger system in which the programmable IC is included.

In other cases, even if the original circuit designers are available for troubleshooting, the ability to re-configure the programmable IC means that there is no guarantee that the circuit design implemented within the programmable IC at the time that troubleshooting is performed is the same as the original circuit design.

SUMMARY

A method includes loading a first configuration bitstream into an integrated circuit (IC), wherein the first configuration bitstream includes a first circuit design and metadata for a second circuit design. The method includes storing the metadata within a memory of the IC, detecting a configuration bitstream load condition, and, responsive to the configuration bitstream load condition, loading a second configuration bitstream into the IC. The second configuration bitstream includes the second circuit design.

An IC includes a memory interface and a memory coupled to the memory interface, wherein the memory stores, from a first configuration bitstream, metadata for a circuit design. The IC further includes a boot agent circuit implemented within programmable circuitry of the IC. The boot agent circuit is configured to detect a configuration bitstream load condition and, responsive to detecting the configuration bitstream load condition, initiate loading of a second configuration bitstream including the circuit design.

A system includes a host device, a configuration device storing a first configuration bitstream and a second configuration bitstream, and an IC coupled to the host device and the configuration device. The IC includes a port, a memory storing, from the first configuration bitstream, metadata for a circuit design, and a memory interface coupled to the port and the memory. The memory interface is configured to read the metadata from the memory and provide the metadata to the port. The IC further includes a boot agent circuit implemented within programmable circuitry of the IC. The boot agent circuit is configured to detect a configuration bitstream load condition and, responsive to detecting the configuration bitstream load condition, initiate loading of the second configuration bitstream including the circuit design. The host device receives the metadata through the port.

This Summary section is provided merely to introduce certain concepts and not to identify any key or essential features of the claimed subject matter. Other features of the inventive arrangements will be apparent from the accompanying drawings and from the following detailed description.

BRIEF DESCRIPTION OF THE DRAWINGS

The inventive arrangements are illustrated by way of example in the accompanying drawings. The drawings, however, should not be construed to be limiting of the inventive arrangements to only the particular implementations shown. Various aspects and advantages will become apparent upon review of the following detailed description and upon reference to the drawings.

DETAILED DESCRIPTION OF THE DRAWINGS

Figure 1:
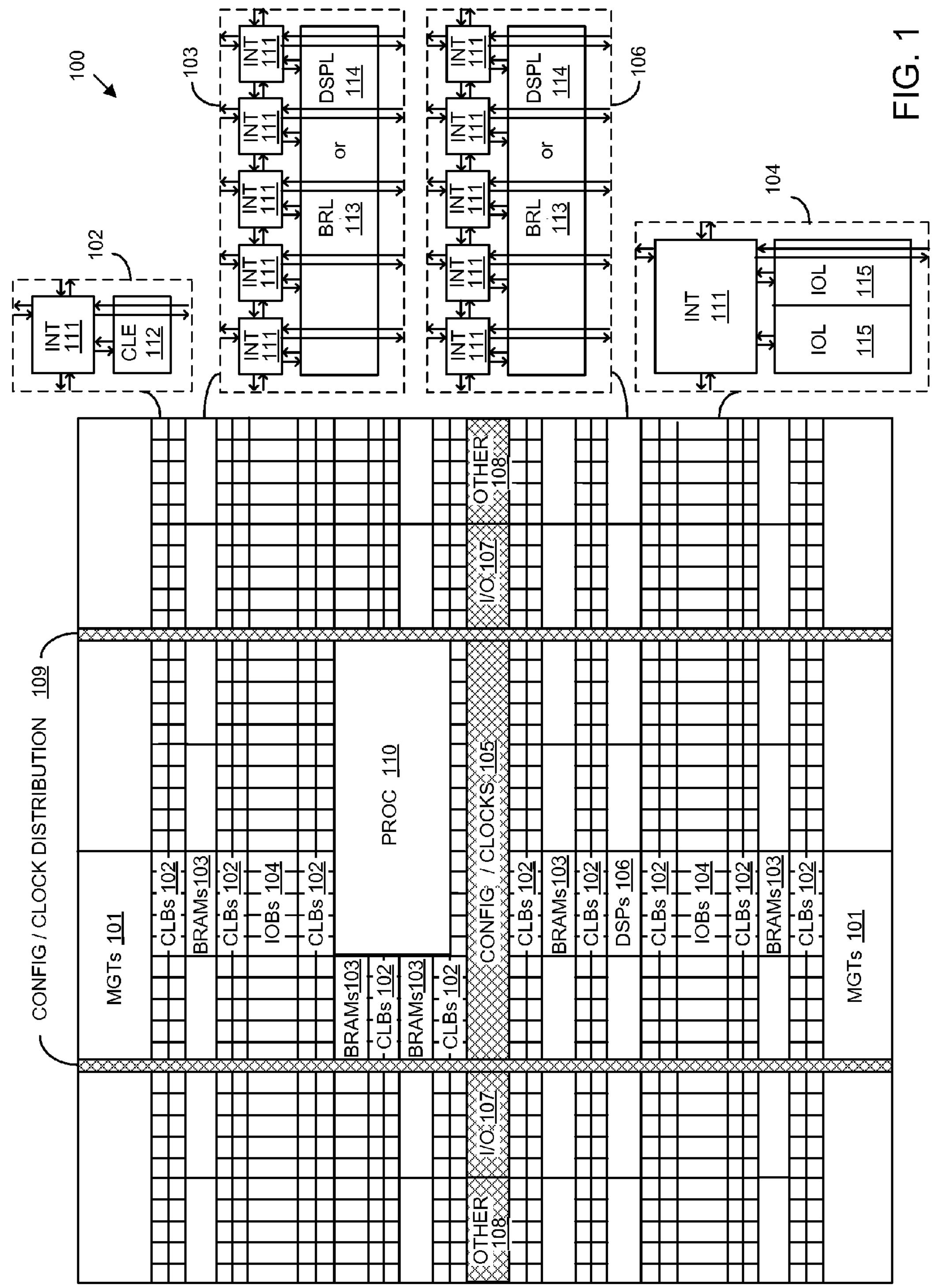
FIG. 1 is a block diagram illustrating an exemplary architecture for an integrated circuit (IC).

While the disclosure concludes with claims defining novel features, it is believed that the various features described within this disclosure will be better understood from a consideration of the description in conjunction with the drawings. The process(es), machine(s), manufacture(s) and any variations thereof described herein are provided for purposes of illustration. Specific structural and functional details described within this disclosure are not to be interpreted as limiting, but merely as a basis for the claims and as a representative basis for teaching one skilled in the art to variously employ the features described in virtually any appropriately detailed structure. Further, the terms and phrases used within this disclosure are not intended to be limiting, but rather to provide an understandable description of the features described.

This disclosure relates to integrated circuits (ICs). More particularly, this disclosure relates to transferring metadata, relating to a circuit design, to an IC and making the metadata available for use. In accordance with the inventive arrangements disclosed herein, a programmable IC may be initially loaded with metadata describing a circuit design and/or other system. The metadata, once loaded into memory of the programmable IC, may be read by a host device. In some cases, the host device is an external device such as a processor, system, or the like. In other cases, the host device is a processor implemented within the programmable IC itself.

Subsequent to loading the metadata into memory, the programmable IC is loaded with the circuit design described by the metadata. Accordingly, the host device, having read the metadata and stored the metadata for further use and/or recall, has knowledge of particular implementation details of the circuit design now implemented within the programmable IC. The host device may perform one or more operations using the metadata. For example, the metadata may specify a portion of a device tree for a processor implemented within the programmable IC or a processor external to the IC, e.g., whether the processor is the host device or a different device. In other cases, the host device, whether implemented within the programmable IC or external to the programmable IC, may compare the metadata with a specification for the circuit design and initiate one or more update operations responsive to the comparison.

The inventive arrangements described herein may be implemented as a method or process performed by a system. The system may be implemented as a single IC, e.g., a programmable IC, or implemented as two or more ICs coupled together. The system further may include a host device which may be implemented as a data processing system, a processor, IC, or as a processor implemented within the programmable IC itself. In another aspect, the inventive arrangements may be implemented, at least in part, as a programmable IC. The programmable IC may include a processor. The processor may function as the host device. The inventive arrangements also may be implemented as a system including a programmable IC and one or more other devices, ICs, and/or systems coupled to the programmable IC.

For purposes of simplicity and clarity of illustration, elements shown in the figures have not necessarily been drawn to scale. For example, the dimensions of some of the elements may be exaggerated relative to other elements for clarity. Further, where considered appropriate, reference numbers are repeated among the figures to indicate corresponding, analogous, or like features.

FIG. 1 is a block diagram illustrating an exemplary architecture 100 for an IC. In one aspect, architecture 100 is implemented within a field programmable gate array (FPGA) type of IC. Architecture 100 is also representative of an SOC type of IC. As noted, an SOC is an IC that includes a processor that executes program code and one or more other circuits and/or circuit systems. The circuits and/or circuit systems may operate cooperatively with one another and with the processor.

As shown, architecture 100 includes several different types of programmable circuit, e.g., logic, blocks. For example, architecture 100 may include a large number of different programmable tiles including multi-gigabit transceivers (MGTs) 101, configurable logic blocks (CLBs) 102, random access memory blocks (BRAMs) 103, input/output blocks (IOBs) 104, configuration and clocking logic (CONFIG/CLOCKS) 105, digital signal processing blocks (DSPs) 106, specialized I/O blocks 107 (e.g., configuration ports and clock ports), and other programmable logic 108 such as digital clock managers, analog-to-digital converters, system monitoring logic, and so forth.

In some ICs, each programmable tile includes a programmable interconnect element (INT) 111 having standardized connections to and from a corresponding INT 111 in each adjacent tile. Therefore, INTs 111, taken together, implement the programmable interconnect structure for the illustrated IC. Each INT 111 also includes the connections to and from the programmable logic element within the same tile, as shown by the examples included at the top of FIG. 1.

For example, a CLB 102 may include a configurable logic element (CLE) 112 that may be programmed to implement user logic plus a single INT 111. A BRAM 103 may include a BRAM logic element (BRL) 113 in addition to one or more INTs 111. Typically, the number of INTs 111 included in a tile depends on the height of the tile. As pictured, a BRAM tile has the same height as five CLBs, but other numbers (e.g., four) also may be used. A DSP tile 106 may include a DSP logic element (DSPL) 114 in addition to an appropriate number of INTs 111. An 10B 104 may include, for example, two instances of an I/O logic element (IOL) 115 in addition to one instance of an INT 111. As will be clear to those of skill in the art, the actual I/O pads connected, for example, to IOL 115 typically are not confined to the area of IOL 115.

In the example pictured in FIG. 1, a columnar area near the center of the die, e.g., formed of regions 105, 107, and 108, may be used for configuration, clock, and other control logic. Region 105, for example, may include a configuration controller that is operable to load a configuration bitstream into configuration memory cells (not shown). Horizontal areas 109 extending from this column are used to distribute the clocks and configuration signals across the breadth of the programmable IC.

Some ICs utilizing the architecture illustrated in FIG. 1 include additional logic blocks that disrupt the regular columnar structure making up a large part of the IC. The additional logic blocks may be programmable blocks and/or dedicated circuitry. For example, a processor block depicted as PROC 110 spans several columns of CLBs and BRAMs.

In one aspect, PROC 110 is implemented as a dedicated circuitry, e.g., as a hardwired processor, that is fabricated as part of the die that implements the programmable circuitry of the IC. PROC 110 may represent any of a variety of different processor types and/or systems ranging in complexity from an individual processor, e.g., a single core capable of executing program code, to an entire processor system having one or more cores, modules, co-processors, interfaces, or the like. PROC 110, unlike the configuration controller, may execute user program code.

In another aspect, PROC 110 is omitted from architecture 100 and replaced with one or more of the other varieties of the programmable blocks described. Further, such blocks may be utilized to form a "soft processor" in that the various blocks of programmable circuitry may be used to form a processor that can execute program code as is the case with PROC 110.

The phrase "programmable circuitry" refers to programmable circuit elements within an IC, e.g., the various programmable or configurable circuit blocks or tiles described herein, as well as the interconnect circuitry that selectively couples the various circuit blocks, tiles, and/or elements according to configuration data that is loaded into the IC. For example, portions shown in FIG. 1 that are external to PROC 110 such as CLBs 102 and BRAMs 103 are considered programmable circuitry of the IC.

In general, the functionality of programmable circuitry is not established until configuration data is loaded into the IC. A set of configuration bits may be used to program programmable circuitry of an IC such as an FPGA. The configuration bit(s) typically are referred to as a "configuration bitstream." In general, programmable circuitry is not operational or functional without first loading a configuration bitstream into the IC. The configuration bitstream effectively implements or instantiates a particular circuit design within the programmable circuitry. The circuit design specifies, for example, functional aspects of the programmable circuit blocks and physical connectivity among the various programmable circuit blocks.

Circuitry that is "hardwired" or "hardened," i.e., not programmable, is manufactured as part of the IC. Unlike programmable circuitry, hardwired circuitry or circuit blocks are not implemented after the manufacture of the IC through the loading of a configuration bitstream. Hardwired circuitry is generally considered to have dedicated circuit blocks and interconnects, for example, that are functional without first loading a configuration bitstream into the IC, e.g., PROC 110 or the configuration controller.

In some instances, hardwired circuitry may have one or more operational modes that can be set or selected according to register settings or values stored in one or more memory elements within the IC. The operational modes may be set, for example, through the loading of a configuration bitstream into the IC. Despite this ability, hardwired circuitry is not considered programmable circuitry as the hardwired circuitry is operable and has a particular function when manufactured as part of the IC.

FIG. 1 is intended to illustrate an exemplary architecture that may be used to implement an IC that includes programmable circuitry, e.g., a programmable fabric. For example, the number of logic blocks in a column, the relative width of the columns, the number and order of columns, the types of logic blocks included in the columns, the relative sizes of the logic blocks, and the interconnect/logic implementations included at the top of FIG. 1 are purely exemplary. In an actual IC, for example, more than one adjacent column of CLBs is typically included wherever the CLBs appear, to facilitate the efficient implementation of a user circuit design. The number of adjacent CLB columns, however, may vary with the overall size of the IC. Further, the size and/or positioning of blocks such as PROC 110 within the IC are for purposes of illustration only and are not intended as a limitation.

Figure 2:
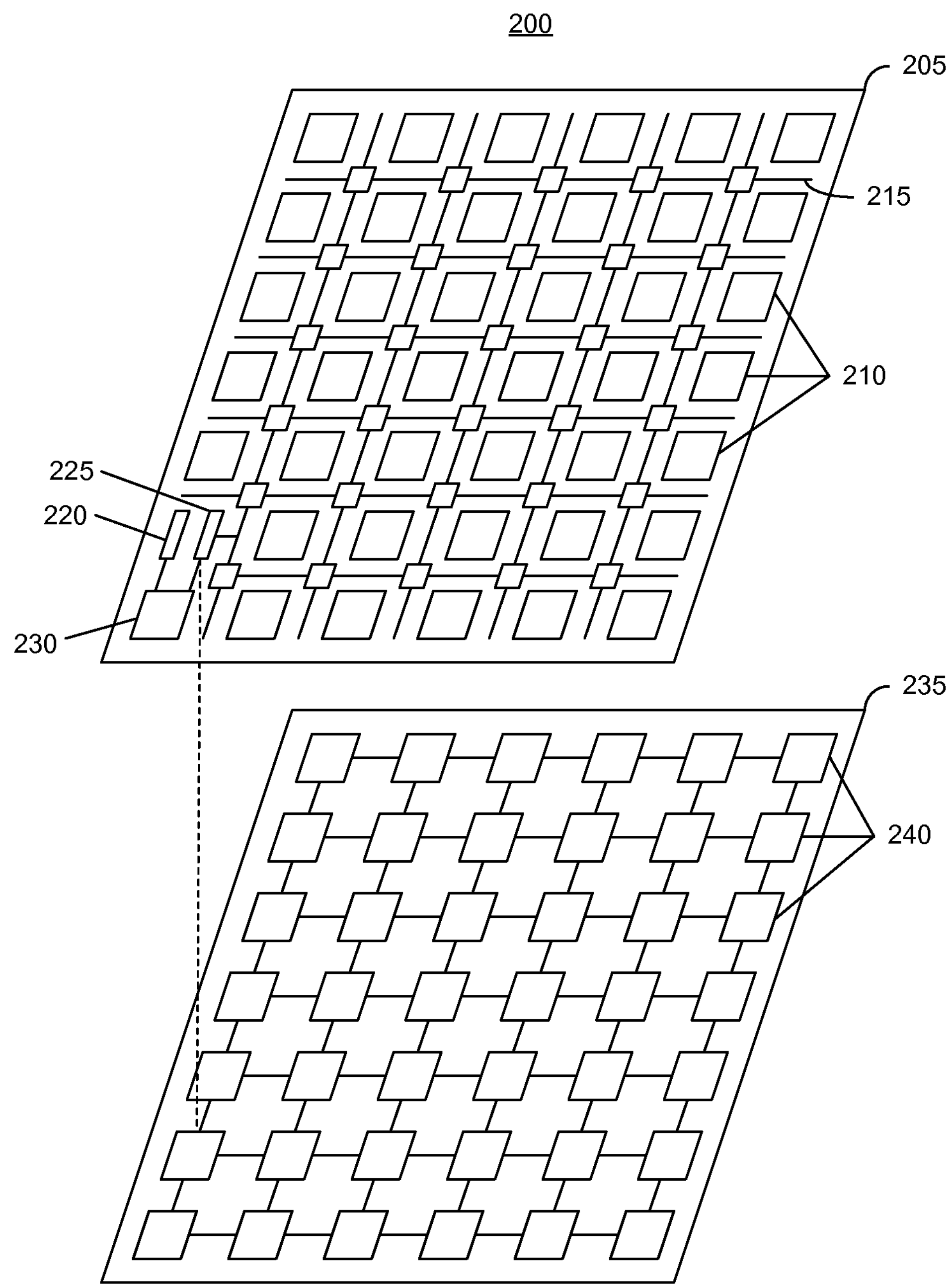
FIG. 2 is a block diagram illustrating a conceptual view of an IC.

FIG. 2 is a block diagram illustrating a conceptual view of an IC 200. IC 200 may be implemented as a programmable IC such as an FPGA having an architecture the same as, or similar to, architecture 100 of FIG. 1. IC 200 is conceptually divided into a programmable circuitry plane 205 and a configuration plane 235. Programmable circuitry plane 205, for example, includes programmable tiles 210 as described above such as CLBs, IOBs, etc., and programmable interconnects 215. Programmable circuitry plane 205 further may include a configuration port 220, an internal configuration access port (ICAP) 225, and a configuration controller 230. Configuration plane 235 includes configuration memory cells 240. In an actual programmable IC, configuration memory cells 240 and programmable tiles 210 are interspersed on IC 200.

Each programmable element in programmable circuitry plane 205 is configured by one or more associated configuration memory cells 240. Configuration memory cells 240 may be written and/or read by configuration controller 230. Configuration controller 230 is accessed by way of configuration port 220 by devices and/or systems external to IC 200 and by ICAP 225 by circuits within IC 200. As pictured, ICAP 225 is coupled to programmable interconnect 215 so configured logic circuits such as a processing core or the like may read and/or write configuration memory cells 240 through ICAP 225. In some examples, a Joint Test Action Group (JTAG) port is also coupled to configuration controller 230 through a hardwired connection.

IC 200, for example, may be coupled to a configuration device (not shown) that stores one or more configuration bitstreams. Examples of configuration devices include, but are not limited to, a serial programmable read only memory (SPROM), an electrically programmable read only memory (EPROM), and a microprocessor. Configuration port 220 may receive configuration data, usually in the form of one or more configuration bitstreams, from the configuration device. Typically configuration port 220 contains a set of mode pins, a clock pin and a configuration data input pin. Configuration data from the configuration device is typically transferred to IC 200 through one or more configuration data input pins coupled to configuration port 220. Further, some ICs allow configuration through a boundary scan chain (not shown).

Figure 3:
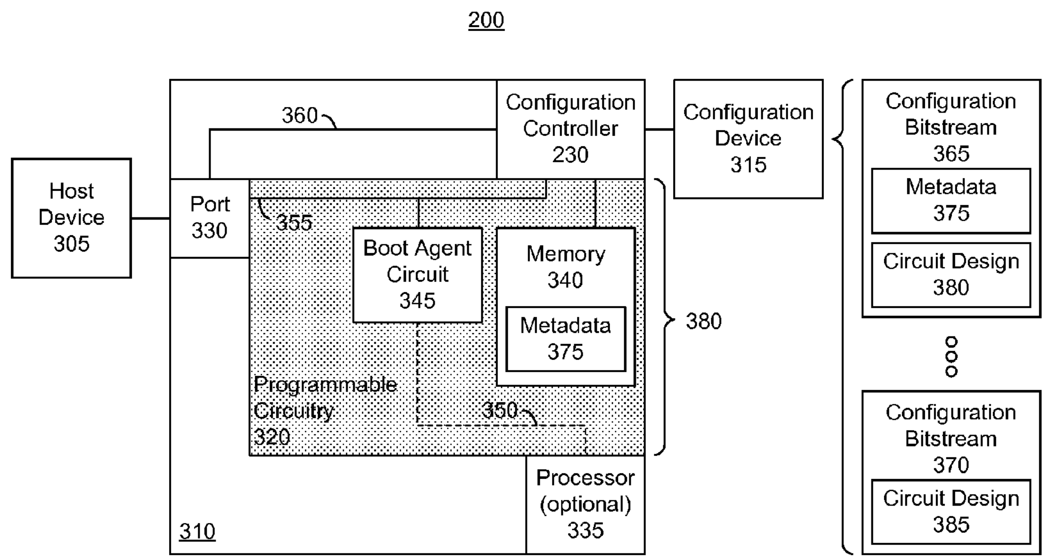
FIG. 3 is a block diagram illustrating an exemplary system.

FIG. 3 is a block diagram illustrating an exemplary system 300. System 300 includes a host device 305, an IC 310, and a configuration device 315. Host device 305, IC 310, and configuration device 315 are coupled to one another as pictured. In one aspect, host device 305, IC 310, and configuration device 315 may be mounted or coupled to a circuit board, e.g., a printed circuit board (PCB). In this regard, system 300 may be incorporated within a larger system.

Host device 305 may be implemented as an IC such as a processor. In one aspect, host device 305 may be configured to execute program code. IC 310 is implemented as a programmable IC. For example, IC 310 may utilize architecture 100 described herein with reference to FIG. 1 and/or the architecture described with reference to FIG. 2. IC 310 includes programmable circuitry 320. IC 310 further includes configuration controller 230, a port 330, and an optional processor 335. Host device 305 couples to IC 310 through port 330. Configuration controller 230 is coupled to configuration device 315 through configuration port 220 (not shown).

Configuration controller 230 is implemented as a hardwired circuit. Configuration controller 230 is responsible for obtaining configuration bitstreams from configuration device 315 and loading the configuration bitstream into appropriate configuration memory cells (not shown) of IC 310. Once a configuration bitstream is loaded into configuration memory cells by configuration controller 230, any circuit design and/or circuitry specified by the configuration bitstream is implemented within programmable circuitry 320.

In addition, configuration controller 230 is able to write data into memories of IC 310 including various memory elements within programmable circuitry 320. For example, as part of a circuit design, various data tables may need to be stored within IC 310. Configuration controller 230 stores such data, which is part of a configuration bitstream, within the various memory elements of programmable circuitry 320. In this regard, configuration controller further may read from such memories. Accordingly, configuration controller 230 is able to read and/or write to configuration memory cells and to memory elements of programmable circuitry 320. As such, configuration controller 230 may be referred to herein as a "memory interface" or "interface" from time to time.

Port 330 may be implemented as any of a variety of different port types. Exemplary types of ports for implementing port 330 include, but are not limited to, JTAG, Universal Serial Bus, Ethernet, Peripheral Component Interconnect Express (PCIe), or the like. In one aspect, port 330 may be implemented as a dedicated port in IC 310. For example, JTAG is a dedicated port. In another aspect, port 330 may be implemented using various I/O circuit blocks such as one or more of the MGTs described with reference to FIG. 1.

When included and implemented as a hardwired circuit block, processor 335 may perform a boot process that is independent of the boot, or startup, process of programmable circuitry 320. In this regard, processor 335, when included and implemented as a hardwired circuit block, may operate independently of programmable circuitry 320.

Configuration device 315 stores one or more configuration bitstreams that may be loaded into IC 310. In one aspect, configuration device 315 is configured to store configuration bitstreams and provide configuration bitstreams, e.g., a selected configuration bitstream, to IC 310 responsive to a request from configuration controller 230. In the example pictured in FIG. 3, configuration device 315 stores configuration bitstream 365 and configuration bitstream 370. Configuration device 315 may also store one or more additional bitstreams. Configuration bitstream 365 includes metadata 375 and circuit design 380. Configuration bitstream 370 includes circuit design 385. In the case where configuration device 315 stores additional configuration bitstreams, such additional configuration bitstreams may include additional metadata or additional metadata and a circuit design.

Circuit design 380 and circuit design 385 implement different physical circuits within programmable circuitry 320. Metadata 375 is data that describes various aspects of circuit design 385. For example, metadata 375 may include and/or describe the various cores and/or Intellectual Property (IP) included within circuit design 385 and/or within IC 310, revision codes for hardware and/or software of circuit design 385, IC 310, and/or cores or IP contained in circuit design 385, configuration parameters of circuit design 385, memory maps of circuit design 385, driver requirements of circuit design 385, and/or other data necessary for supporting embedded performance measurement and/or test capabilities of circuit design 385 and/or IC 310. In a further aspect, metadata 375 may include executable program code that may be provided to, and executed by, host device 305 and/or processor 335.

Circuit design 380 specifies circuitry to be implemented within programmable circuitry 320 that facilitates storage and retrieval of metadata 375 within programmable circuitry 320. For example, circuit design 380 may specify, or create, a memory 340, a boot agent circuit 345, and cause configuration controller 230 to store metadata 375 within memory 340 once formed. Circuit design 380 further specifies connectivity among the various elements described.

In operation, IC 310 implements a boot process in which a configuration bitstream is loaded. The boot process may be initiated by host device 305, by processor 335 when included, by circuitry implemented within programmable circuitry 320, and/or responsive to a system 300 wide boot and/or initialization process.

In one aspect, responsive to initiating the boot process, IC 310 may enter a metadata transfer mode automatically. In that case, responsive to initiating the boot process, configuration controller 230 automatically loads configuration bitstream 365. In another aspect, host device 305 and IC 305 may communicate to determine whether to enter metadata transfer mode. For example, IC 310 may include a non-volatile register that may be read by host device 305. The value stored in the non-volatile register indicates whether host device 305 has read metadata 375 or not. Host device 305 may read the non-volatile register and determine whether metadata 375 for circuit design 385 has already been read. If so, responsive to determining that metadata 375 has been read, host device 305 may instruct configuration controller 230 not to enter metadata transfer mode. In that case, configuration controller 230 loads configuration bitstream 370 directly without loading any other configuration bitstream that includes metadata. For example, configuration controller 230 effectively skips loading configuration bitstream 365 and proceeds to directly load configuration bitstream 370.

If the value of the non-volatile register indicates that metadata 375 has not been read, host device 305 instructs configuration controller 230 enter metadata transfer mode and load configuration bitstream 365. Prior to implementing configuration bistream 370, the non-volatile register is written with the value indicating that metadata 375 has been read. The non-volatile register may be written by configuration controller 230, by boot agent circuit 345, processor 335 if included, and/or another memory interface.

Continuing with the example where metadata transfer mode is implemented, configuration controller 230 accesses configuration device 315 and requests and/or retrieves configuration bitstream 365. Configuration controller 230 loads configuration bitstream 365 into configuration memory cells thereby implementing circuit design 380 within programmable circuitry 320. By implementing circuit design 380, boot agent circuit 345 and memory 340 are implemented within programmable circuitry 320. Further, configuration controller 230 stores metadata 375 within memory 340.

In one aspect, configuration controller 230 may include decryption circuitry. Configuration bitstreams may be encrypted to protect against unauthorized access to the circuit design specified therein. In this regard, configuration bitstream 365 may be encrypted as stored within configuration device 315. Because configuration bitstreams 365 and 370 may be encrypted, metadata 375 is also encrypted and protected from unauthorized access. The built in decryption circuitry of configuration controller 230 may be used in this manner to protect metadata 375 as metadata 375 is not decrypted until loaded into IC 310 and stored within memory 340.

In one aspect, memory 340 may be implemented using one or more coupled BRAMs. In another aspect, memory 340 may be implemented using one or more look-up tables which are included within CLBs. In another aspect, memory 340 may be implemented using one or more flip-flops which are also included in CLBs. In still another aspect, memory 340 may be implemented using one or more configuration memory cells (e.g., configuration memory cells 240) of IC 310 that are not required or used to store configuration bitstream 365. It should be appreciated that memory 340 may also be implemented using any combination of the foregoing memory elements.

In some exemplary ICs, memory 340 may be implemented using one or more memory elements, e.g., flip-flops, BRAMs, etc., that are coupled together natively as part of a scan chain structure. As part of the regular architecture of the IC, the scan chain may be read via a port such as a JTAG port of the IC.

Having formed memory 340, configuration controller 230 loads metadata 375 into memory 340. Once memory 340 is implemented and stores metadata 375, memory 340 is only read in order to effectuate the transfer of metadata 375. Memory 340 is not written, for example, while circuit design 380 remains implemented within programmable circuitry 320. Accordingly, memory 340 may be configured by configuration bitstream 365 as a read-only memory. Implementation of memory 340 as a read-only memory, however, is not intended as a limitation or requirement as memory 340 may be configured for read and/or write access.

As noted, loading configuration bitstream 365 also implements boot agent circuit 345 within programmable circuitry 320. Boot agent circuit 345 is coupled to port 330 and to configuration controller 230. In one aspect, port 330 is coupled to configuration controller 230 through programmable circuitry 320. For example, port 330 may be coupled to configuration controller 230 through the ICAP illustrated as signal 355. Similarly, boot agent circuit 345 may be coupled to configuration controller 230 through signal 355, e.g., via the ICAP. In another aspect, port 330 may be coupled to configuration controller 230 through a hardwired connection illustrated as signal 360.

Boot agent circuit 345 is responsible for detecting a configuration bitstream load condition. In response to detecting a configuration bitstream load condition, boot agent circuit 345 initiates the loading of a configuration bitstream from configuration device 315. More particularly, boot agent circuit 345 signals configuration controller 230 to load a configuration bitstream through signal 355 responsive to detection of the configuration bitstream load condition.

In one aspect, the configuration bitstream load condition is the detection of one or more predetermined signals from host device 305 by way of port 330. In cases where processor 335 functions as the host device, boot agent circuit 345 is coupled to processor 335 shown as signal 350 in dashed line. In such cases, the configuration bitstream load condition may be the detection of one or more predetermined signals from processor 335. In another aspect, the configuration bitstream load condition is the passage of a predetermined amount of time as described herein in further detail, e.g., a timeout condition.

It should be appreciated, that not all of the signals pictured within IC 310 are required for all of the various implementations described. For example, in the case where boot agent 345 is configured to determine the occurrence of a configuration bitstream load condition from the passage of time, boot agent circuit 345 need not be coupled to port 330. In cases where the configuration bitstream load condition is unrelated to processor 335, signal 350 need not be included. In other aspects, processor 335 may be implemented as a soft processor within programmable circuitry 320.

In a first operational example, boot agent circuit 345 provides timer functionality. Once implemented, boot agent circuit 345 may detect the passage of a predetermined amount of time. Responsive to the passing and/or expiration of the predetermined amount of time, boot agent circuit 345 signals configuration controller 230 to load configuration bitstream 370 or a next configuration bitstream. Within the predetermined amount of time, host device 305 reads metadata 375 stored in memory 340 by way of port 330 and a memory interface which, in this example, is configuration controller 230.

In the example described, IC 310 does not check or otherwise ensure that host device 305 has finished reading metadata 375 from memory 340 prior to initiating loading of configuration bitstream 370. Instead, the predetermined amount of time is set to an amount sufficient for host device 305 to read metadata 375 given the amount of metadata 375 and speed of port 330.

The timer implementation described may also be used in cases where host device 305 may not support metadata transfer. For example, in the case where the host device 305 does not support metadata transfer, the predetermined amount of time expires and circuit design 385 is implemented thereafter by way of loading configuration bitstream 370 as expected by host device 305.

Continuing with the first example, in some cases IC 310 may provide a notification to host device 305 that metadata 375 is available. Host device 305 may monitor, or poll, a particular memory location of IC 310 for a particular value. The memory location may be within memory 340. The notification may be the writing of the particular value to the memory location. Responsive to determining that the memory location includes the particular value, e.g., a bit pattern, host device 305 determines that metadata 375 is available for reading from memory 340. Accordingly, host device 305 begins reading metadata 375 from memory 340. The particular value stored within the designated memory location monitored by host device 305 may be stored and/or implemented as a result of implementing circuit design 380.

In a second example, boot agent circuit 345 provides handshake signaling with host device 305 through signal 355 and port 330. For example, boot agent circuit 345, once implemented, may provide a notification to host device 305 that metadata 375 is stored within memory 340 as one or more signals sent through port 330. Responsive to the notification, host device 305 may read metadata 375 from memory 340.

Continuing with the second example, boot agent circuit 345 may wait for a signal from host device 305 that host device 305 is finished reading metadata 375 from memory 340. Responsive to receiving the signal from host device 305, boot agent circuit 345 signals configuration controller 230 to load configuration bitstream 370. It should be appreciated, however, that a timeout mechanism may be used in the second example to prevent a stall in the system. After the predetermined amount of time, for example, boot agent circuit 345 may initiate the loading of configuration bitstream 370 regardless of whether host device 305 has indicated that metadata 375 has been read from memory 340.

As discussed, metadata 375 describes various aspects of circuit design 385 and/or aspects of IC 310. Host device 305 may process metadata 375 or send metadata 375 to one or more other systems and/or ICs for further processing.

In one aspect, each of configuration bitstreams 365 and 370 are implemented as independent or full configuration bitstreams. In that case, loading of configuration bitstream 370 and implementation of circuit design 385 will remove, or overwrite, circuit design 380 and metadata 375 from programmable circuitry 320. In another aspect, configuration bitstream 365 may be implemented as a complete configuration bitstream, while configuration bitstream 370 is implemented as a partial configuration bitstream. In that case, metadata 375 may be overwritten while one or more other circuit blocks such as boot agent circuit 345 are left intact within programmable circuitry 320 depending up preference or the amount of resources needed to implement the circuit blocks of circuit design 385. As such, circuit design 385 may be implemented within programmable circuitry 320 and coexist with one or more circuit blocks of circuit design 380 such as boot agent circuit 345.

Figure 4:
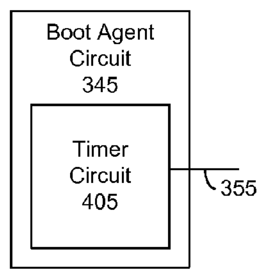
FIG. 4 is a block diagram illustrating an exemplary boot agent circuit.

FIG. 4 is a block diagram illustrating an exemplary implementation of boot agent circuit 345. The example of FIG. 4 illustrates the case where boot agent circuit 345 is configured to detect the expiration of a predetermined amount of time. As pictured, boot agent circuit 345 includes a timer circuit 405. Timer circuit 405 may be implemented as a counter or a timer as the case may be. In this regard, timer circuit 405 may count from a starting value up to a final value or count from a starting value down to a final value, where the time required to count up or count down is the predetermined amount of time. Responsive to timer circuit 405 reaching the final value, timer circuit 405 outputs an indication on signal 355 to configuration controller 230 to load configuration bitstream 370 or a next configuration bitstream as the case may be. Responsive to the signal from boot agent circuit 345, configuration controller 230 reads, or issues a request to load, configuration bitstream 370 or a next configuration bitstream.

Figure 5:
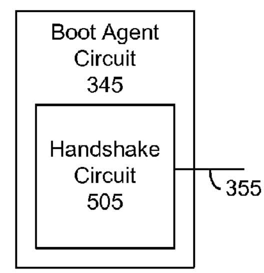
FIG. 5 is a block diagram illustrating another exemplary boot agent circuit.

FIG. 5 is a block diagram illustrating another exemplary implementation of boot agent circuit 345. The example of FIG. 5 illustrates the case where boot agent circuit 345 is configured to perform handshake signaling with host device 305. As pictured, boot agent circuit 345 includes a handshake circuit 505. Handshake circuit 505 may implement the signaling necessary to inform host device 305 that metadata 375 is stored within memory 340. Handshake circuit 505 further may await an indication from host device 305 that host device 305 has finished reading metadata 375. Responsive to receiving the indication from host 305 that metadata 375 is read, handshake circuit 505 outputs an indication on signal 355 to configuration controller 230 to load configuration bitstream 370 or a next configuration bitstream. Responsive to the signal from boot agent circuit 345, configuration controller 230 reads, or issues a request to load, configuration bitstream 370 or a next configuration bitstream.

In another aspect, where boot agent circuit 345 includes a failsafe timeout mechanism, boot agent circuit 345 may include a timer circuit in addition to handshake circuit 505, e.g., both timer circuit 405 and handshake circuit 505. In such an implementation, the timer circuit may be used to initiate the loading of configuration bitstream 370 or a next configuration bitstream after a predetermined amount of time without receiving an indication from host device 305 that metadata 375 has been read.

Figure 6:
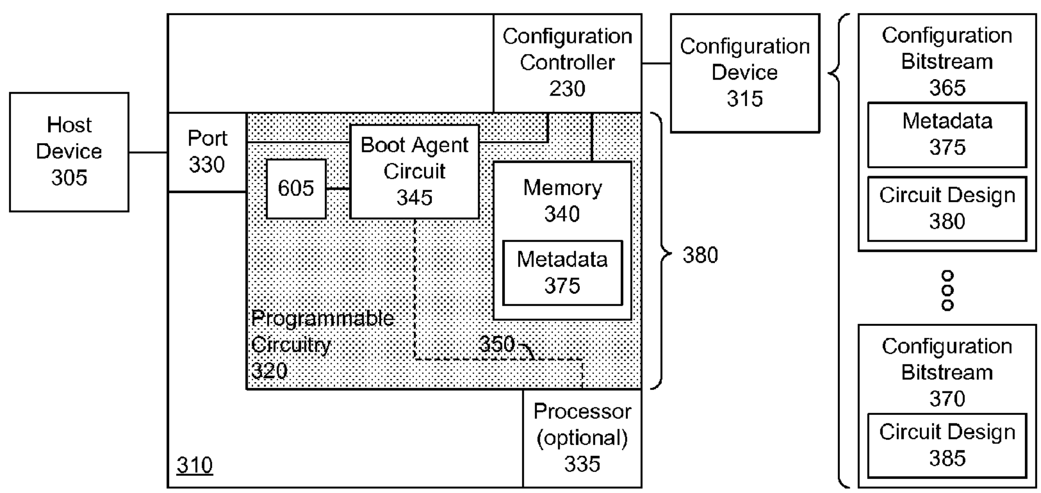
FIG. 6 is a block diagram illustrating another exemplary implementation of the system of FIG. 3.

FIG. 6 is block diagram illustrating another exemplary implementation of system 300. In the example of FIG. 6, boot agent circuit 345 is coupled to port 330 and to configuration controller 230 as an intermediary. Configuration controller 230 operates as a memory interface to memory 340, which stores metadata 375 therein. Thus, like the example of FIG. 3, boot agent circuit 345 utilizes configuration controller 230 as a memory interface to read metadata 375 from memory 340 and provide metadata 375 to host device 305 or processor 335 as the case may be.

Referring to FIG. 6, it should be appreciated that any of the mechanisms described for detecting a configuration bitstream load condition may be implemented by boot agent circuit 345. Further, boot agent circuit 345 may implement any of the notification mechanisms described for notifying a host device of the availability of metadata 375. IC 310 also may be configured to communicate with host device 305 to circumvent implementation of the metadata transfer mode as described with reference to FIG. 3.

Within FIG. 6, an authenticator circuit 605 is optionally implemented within programmable circuitry 320. In one aspect, authenticator circuit 605 may be implemented by configuration bitstream 365. As pictured, authenticator circuit 605 is coupled to boot agent circuit 345. Authenticator circuit 605 may be used to determine whether to grant host device 305 access, or the ability, to read metadata 375 from memory 340. For example, prior to allowing metadata 375 to be read from memory 340, boot agent circuit 345 may receive a key from host device 305. The key may be provided by host device 305 responsive to a notification from IC 310. Host device 305, for example, is prevented from accessing metadata 375 from memory 840 until a valid key is received.

Boot agent circuit 345 provides the key to authenticator circuit 605. Authenticator circuit 605 determines whether the key is valid. If so, authenticator circuit 605 may return a "yes" or affirmative indication to boot agent circuit 345. Only responsive to a "yes" or affirmative indication does boot agent circuit 345 allow the transfer of metadata 375 from memory 340 to host device 305. Responsive to a "no," for example, boot agent circuit 345 may initiate the loading of configuration bitstream 370 thereby deleting metadata 375. A "no" from authenticator circuit 605 may be interpreted as a configuration bitstream load condition by boot agent circuit 345 thereby terminating the metadata transfer mode.

In another example, metadata 375 may be encrypted as stored in memory 340. As noted, configuration bitstream 365 may be encrypted as stored in configuration device 315. Metadata 375 within configuration bitstream 365, however, may be encrypted independently of configuration bitstream 365 using a different key. As such, metadata 375, when stored in memory 340, may still be encrypted despite configuration bitstream 365 having been decrypted for purposes of implementation within IC 310.

In one aspect, boot agent circuit 345, responsive to receiving a "yes" from authenticator circuit 605, may decrypt metadata 375 as stored in memory 340 prior to sending metadata 375 to host device 305. Boot agent circuit 345 may decrypt metadata 375 using the key obtained from host device 305. In still another example, boot agent circuit 345, responsive to receiving a "yes" from authenticator circuit 605, may send encrypted metadata 375 read from memory 340 to decryption circuitry within configuration controller 230 with the key received from host device 305. Configuration controller 230 may decrypt encrypted metadata 375 and provide decrypted metadata 375 back to boot agent circuit 345. Subsequently, boot agent circuit 345 may provide decrypted metadata 375 to host device 305. It should be appreciated that metadata 375 may be encrypted and/or decrypted as described above regardless of whether configuration bitstream 365 is encrypted as stored within configuration device 315.

While authenticator circuit 605 is illustrated as being implemented within programmable circuitry 320, in another aspect, authenticator circuit 605 may be implemented as a hardwired circuit of IC 310. When implemented as a hardwired circuit block, authenticator 605 is not specified by, or implemented by, configuration bitstream 365. In addition, authenticator circuit 605 may be used to validate a key that may be received from a host that is implemented within IC 310. For example, processor 335 or other circuitry may provide a key that may be validated by authenticator circuit 605 as described above. Accordingly, whether a host is internal or external, the host may be prevented from accessing metadata 375 from memory 840 until the host provides a valid key, as determined by authenticator circuit 605.

Figure 7:
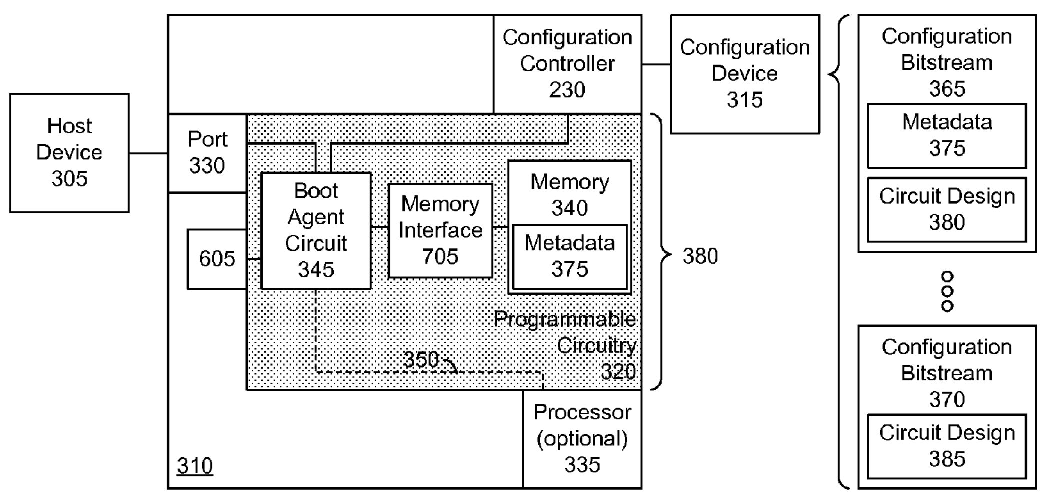
FIG. 7 is a block diagram illustrating another exemplary implementation of the system of FIG. 3.

FIG. 7 is block diagram illustrating another exemplary implementation of system 300. In the example of FIG. 7, a memory interface 705 is implemented within programmable circuitry 320 as opposed to using configuration controller 230 as a memory interface. Thus, configuration bitstream 365 implements boot agent circuit 345, memory interface 705, and memory 340. Boot agent circuit 345 is still coupled to configuration controller 230 in order to initiate loading of configuration bitstream 370 responsive to a configuration bitstream load condition.

Authenticator 605 optionally may be included. In the example of FIG. 7, authenticator circuit 605 is depicted as a hardwired circuit. It should be appreciated, however, that authenticator circuit 605 may be implemented within programmable circuitry 320 as described with reference to FIG. 6. In this regard, authenticator circuit 605 may be included in any of the examples described with reference to FIG. 3, 6, or 7 and, if included, may be implemented as a soft circuit in programmable circuitry 310 or as a hardwired circuit. Further, as discussed with reference to FIG. 6, authenticator circuit 605 may be used to validate a key that may be received from a host that is implemented within IC 310. For example, processor 335 or other circuitry may provide a key that may be validated by authenticator circuit 605. Accordingly, whether a host is internal or external, the host may be prevented from accessing metadata 375 from memory 840 until the host provides a valid key, as determined by authenticator circuit 605.

Referring to FIG. 7, it should be appreciated that any of the mechanisms described for detecting a configuration bitstream load condition may be implemented by boot agent circuit 345. Further, boot agent circuit 345 may implement any of the notification mechanisms described for notifying a host device of the availability of metadata 375. IC 310 also may be configured to communicate with host device 305 to circumvent implementation of the metadata transfer mode as described with reference to FIG. 3.

In the various examples of system 300 described herein with reference to FIG. 3, 6, or 7, processor 335 may be implemented as a soft processor. In that case, processor 335 is implemented within programmable circuitry 320. As such, processor 335 is implemented by, or specified by, circuit design 380 or a prior implemented circuit design, in which case circuit design 380 may be a partial configuration bitstream. Whether implemented as a soft processor or as a hardwired processor, processor 335 may function as the host device and read and/or obtain metadata from memory 340 as described herein.

Figure 8:
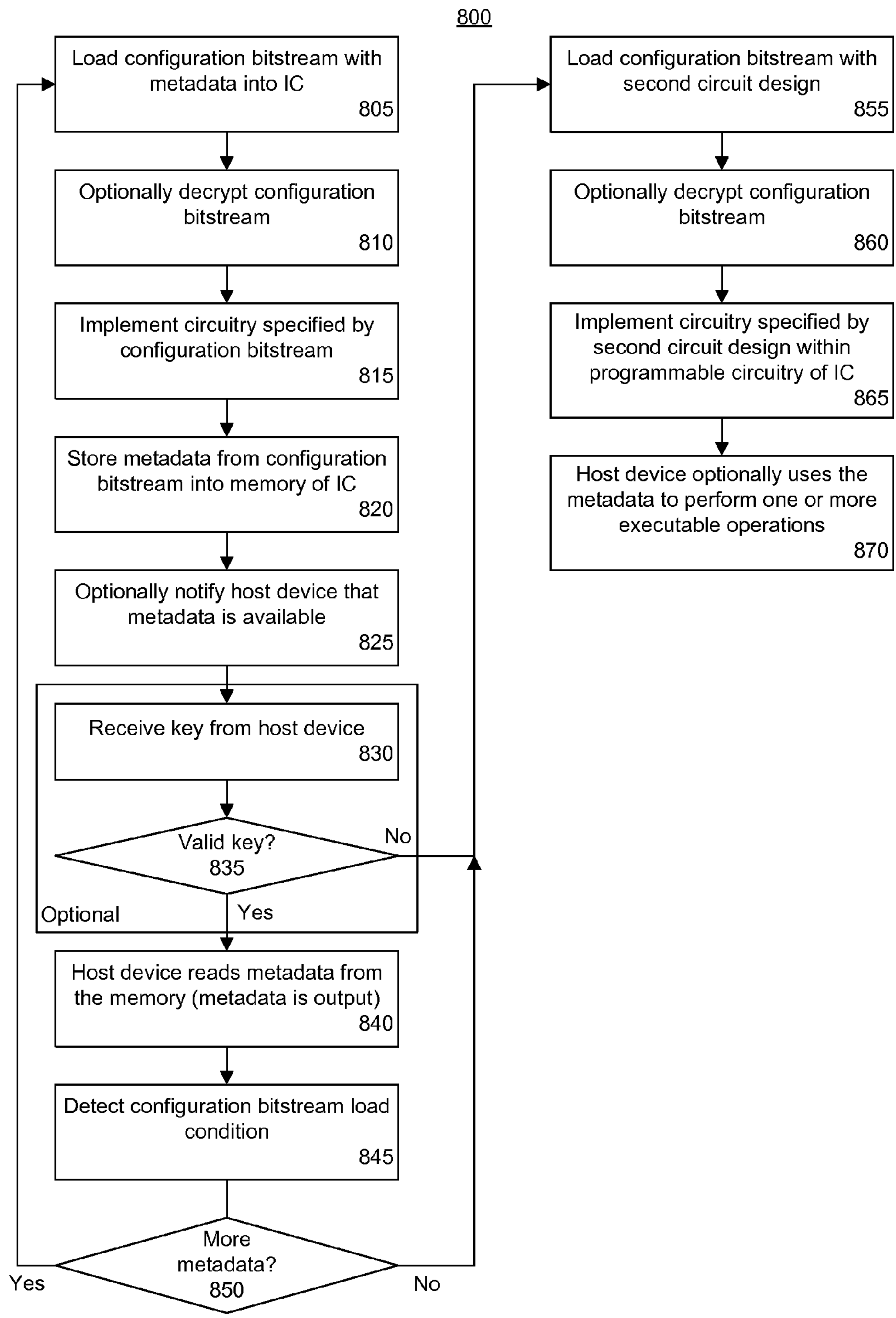
FIG. 8 is a flow chart illustrating an exemplary method of metadata transfer for an IC.

FIG. 8 is a flow chart illustrating an exemplary method 800 of metadata transfer for an IC. Method 800 begins in block 805 where a configuration bitstream is loaded into the programmable IC. The configuration bitstream includes, or specifies, metadata and a first circuit design. The first circuit design causes metadata to be loaded into the IC and supports reading of the metadata and/or transfer of the metadata out of the IC. In block 810, the IC optionally decrypts the configuration bitstream. For example, in the case where the configuration bitstream is encrypted, the configuration controller of the IC decrypts the configuration bitstream.

In block 815, responsive to loading the configuration bitstream into the IC, the circuitry specified by the configuration bitstream, e.g., the first circuit design, is implemented within the IC. The first circuit design implements the memory in which the metadata is stored and a mechanism to access the memory. The mechanism may include a boot agent circuit and/or a memory interface. In one aspect, the memory interface may be implemented in the programmable circuitry. In another aspect, the memory interface may be the configuration controller. The first circuit design implements circuitry as described in any of the examples illustrated in FIG. 3, 4, 5, 6, or 7.

In block 820, the configuration controller stores metadata from the configuration bitstream in the memory of the IC implemented by the first circuit design. The memory may optionally be configured as a read-only memory. In block 825, the IC optionally notifies the host device that metadata is available. In one aspect, the notification may be a signal provided to the host device. In another aspect, the notification may be writing a predetermined bit pattern within a designated memory location that is monitored or polled by the host device.

Blocks 830 and 835 represent optional operations. In block 830, the IC receives a key from the host device. In one aspect, the host device may provide the key to the IC responsive to a notification as described with reference to block 825. In block 835, the IC determines whether the key is valid. Responsive to determining that the key is valid, method 800 continues to block 840. Responsive to determining that the key is not valid, method 800 continues to block 855. In the event that the key is determined to be invalid, the host device is prevented from reading the metadata, e.g., the metadata transfer mode is terminated since another circuit design is implemented within the IC thereby overwriting or otherwise deleting the metadata.

In block 840, the host device reads the metadata from the memory. In block 845, the IC detects a configuration bitstream load condition. For example, the boot agent circuit may detect the configuration bitstream load condition. In one aspect, the configuration bitstream load condition is the passage or expiration of a predetermined amount of time. In another aspect, the configuration bitstream load condition is the boot agent circuit receiving a signal from the host device indicating that the host device is finished reading the metadata.

Block 850 illustrates an optional implementation in which additional metadata may be loaded into the IC and read. In cases where the amount of metadata exceeds the size of the memory of the IC, an iterative configuration process may be implemented where further configuration bitstreams are loaded into the IC. Each different configuration bitstream may include different or additional metadata. The metadata for each configuration bitstream is read by the host device prior to loading the next configuration bitstream with additional metadata.

In block 850, the IC determines whether additional metadata is to be loaded. If so, method 800 loops back to block 805 to continue operating. If not, method 800 proceeds to block 855. In one aspect, the metadata may include an indicator or other information specifying whether additional metadata remains. For example, the indicator may specify whether the current metadata is the whole "set" of metadata. In another example, the indicator may specify whether the current metadata is the "last" portion of metadata. In still another example, the indicator may specify more particular information such as, for the current metadata, the particular subset, e.g., the "ith subset," of a total of "N" subsets of metadata. In that case, N may be an integer value specifying the total number of configuration bitstreams including different metadata. In another example, the metadata may specify an address from the configuration device of the next bitstream to be loaded. As such, the host device and/or circuitry within the IC, e.g., the boot agent circuit and/or the configuration controller, may determine whether more metadata exists and continue iterating as described. In this manner, the metadata includes or specifies additional self-describing metadata allowing the boot master, e.g., the host device, the processor, and/or the boot agent circuit, to determine whether to expect and read further metadata through the loading of additional configuration bitstreams including metadata.

While iterating through blocks 805-850 to load further metadata, it should be appreciated that one or more blocks need not be performed during each iteration. For example, blocks 830 and 835 may be performed during the first iteration, but skipped during subsequent iterations where further metadata is loaded. The key need only be checked during the first iteration.

Further, block 815 may be performed using a partial configuration bitstream during subsequent iterations, e.g., any iteration after the first iteration. In that case, the existing circuitry is left intact and the metadata within the memory is overwritten with new and/or different metadata. In another aspect, however, the configuration bitstream is a full configuration bitstream that re-implements circuitry illustrated in any of FIG. 3, 4, 5, 6, or 7. The new and/or different metadata is written to the memory once implemented within the programmable circuitry of the IC.

Continuing with block 855, the IC loads the configuration bitstream with the second circuit design. For example, the configuration controller retrieves and/or reads the configuration bitstream from the configuration device. The configuration bitstream includes a second circuit design that is different from the first circuit design or any circuit design used for reading back metadata. The second circuit design, as discussed, is described by the metadata.

In block 860, the configuration controller optionally decrypts the configuration bitstream. In block 865, responsive to loading the configuration bitstream into the IC, the circuitry specified by the second circuit design is implemented within the programmable circuitry of the IC.

In block 870, the host device optionally uses the metadata to perform one or more executable operations. In one aspect, the host device compares the metadata with a specification for the circuit design. The specification, for example, may indicate the most up-to-date information as to the particular elements that are to be included in the second circuit design. The host device may determine which, if any, elements of the second circuit design are outdated from the comparison with the specification.

The host device, whether external to the IC or within the IC, may compare data items such as the version numbers of cores and/or Intellectual Property (IP), revision codes for hardware and/or software, configuration parameters, memory maps, driver requirements, and/or the like between the specification and the metadata. Responsive to determining that one or more elements of the circuit design are older than what is specified in the specification or mismatch what is specified in the specification, the host device may initiate a process for updating the second circuit design and/or downloading new software. For example, the host device may retrieve a new version of the second configuration bitstream that may be stored in the configuration device for implementation within the IC, a partial configuration bitstream to replace one or more portions of the second configuration bitstream, or the like.

In another example, where the metadata includes or specifies device tree information comprising a full device tree or a portion of a device tree, the processor within the IC may update the device tree used by the processor with the device tree information from the metadata. In this manner, the device tree of the processor may be dynamically updated using the metadata.

In another example, the host device, when external to the IC, may use the device tree information specified within the metadata and map target resources of the IC specified in the device tree to a processor system included within the host device. The resources of the IC specified by the device tree information, in that case, become virtualized resources of the host device that are accessible by the host device.

In still another example, the host device, whether an external processor or an internal processor, may determine that the second circuit design includes a performance measurement and/or test circuit blocks. Having learned of the existence of the circuit blocks and memory map information for interacting with such circuit blocks from the metadata, the host device may directly query the circuit blocks, turn on or off particular functions of the circuit blocks, or the like. In this manner, the host device may react dynamically to the existence of particular features of the second circuit design that, prior to obtaining the metadata, the host device unaware.

In yet another example, the host device, whether an external processor or an internal processor, may compare a version of software of the second circuit design determined from the metadata and to be executed by a processor (e.g., the host device, another external processor, the internal processor, etc.) with a version of the software specified in the specification for the second circuit design. Responsive to determining that the version of the software determined from the metadata is older than the version of the software specified in the specification, the host device may initiate a software update process, e.g., download the newer version of the software, driver, or executable program code as the case may be.

In still another example, the metadata itself may include executable program code. In that case, the host device may replace program code that is stored for execution by the host device or another processor external to the IC with the program code obtained from the metadata.

The inventive arrangements described within this disclosure provide a mechanism for informing a host device of particular implementation details about a circuit design to be implemented within an IC. The metadata is initially stored within the IC, thereby providing the host device with an opportunity to read the metadata. Subsequently, the circuit design described by the metadata is implemented within the IC. The metadata provides personnel with knowledge of the particular circuit design implemented within the IC. Further, the metadata may be used by the host device to automatically update the circuit design, update other systems and/or components, and/or interact with the circuit design.

For purposes of explanation, specific nomenclature is set forth to provide a thorough understanding of the various inventive concepts disclosed herein. The terminology used herein, however, is for the purpose of describing particular aspects of the inventive arrangements only and is not intended to be limiting.

As defined within this disclosure, the terms "a" and "an" mean one or more than one. The term "plurality," as defined herein, means two or more than two. The term "another," as defined herein, means at least a second or more. The term "coupled," as defined herein, means connected, whether directly without any intervening elements or indirectly with one or more intervening elements, unless otherwise indicated. Two elements may also be coupled mechanically, electrically, or communicatively linked through a communication channel, pathway, network, or system.

As defined herein, the term "automatically" means without user intervention. As defined herein, the term "user" or "designer" means a human being. The term "and/or," as defined herein, means any and all possible combinations of one or more of the associated listed items. The terms "includes" and/or "including," when used in this disclosure, specify the presence of stated features, integers, steps, operations, elements, and/or components, but do not preclude the presence or addition of one or more other features, integers, steps, operations, elements, components, and/or groups thereof. Although the terms "first," "second," etc. may be used herein to describe various elements, these elements should not be limited by these terms, as these terms are only used to distinguish one element from another unless the context indicates otherwise.

As defined herein, the term "if" means "when," "upon," "in response to determining," "in response to detecting," "responsive to determining," or "responsive to detecting," depending on the context. Similarly, the phrase "if it is determined" or the phrase "if [a stated condition or event] is detected," as defined herein, means "upon determining," "in response to determining," "responsive to determining," "upon detecting [the stated condition or event]," "in response to detecting [the stated condition or event]," or "responsive to detecting [the stated condition or event]," depending on the context.

Within this disclosure, the same reference characters are used to refer to terminals, signal lines, wires, and their corresponding signals. In this regard, the terms "signal," "wire," "connection," "terminal," and "pin" may be used interchangeably, from time-to-time, within this disclosure. It also should be appreciated that the terms "signal," "wire," or the like may represent one or more signals, e.g., the conveyance of a single bit through a single wire or the conveyance of multiple parallel bits through multiple parallel wires. Further, each wire or signal may represent bi-directional communication between two, or more, components connected by a signal or wire as the case may be.

One or more aspects described within this disclosure may be realized in hardware or a combination of hardware and software. One or more aspects may be realized in a centralized fashion in one system or in a distributed fashion where different elements are spread across several interconnected systems. Any kind of data processing system or other apparatus adapted for carrying out at least a portion of the methods described herein is suited.

One or more aspects further may be embedded in a computer program product, which includes all the features enabling the implementation of the methods described herein. The computer program product includes a computer-readable data storage medium. As defined herein, the phrase "computer-readable storage medium" means a storage medium that contains or stores program code for use by or in connection with an instruction execution system, apparatus, or device. As defined herein, a "computer-readable storage medium" is non-transitory and, as such, is not a transitory propagating signal per se. Examples of a computer-readable storage medium may include, but are not limited to, optical media, magnetic media, magneto-optical media, computer memory such as random access memory, a bulk storage device, e.g., hard disk, or the like.

The flowchart and block diagrams in the Figures illustrate the architecture, functionality, and operation of possible implementations of systems, methods and computer program products according to various aspects of the inventive arrangements disclosed herein. In this regard, each block in the flowchart or block diagrams may represent a module, segment, or portion of code, which includes one or more executable instructions for implementing the specified function(s). It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

In one aspect, the blocks in the flow chart illustration may be performed in increasing numeric order corresponding to the numerals in the various blocks or corresponding to the directional arrows. In other aspects, the blocks may be performed in an order that is different, or that varies, from the numerals in the blocks and/or the directional arrows. For example, two or more blocks shown in succession may be executed substantially concurrently. In other cases, two or more blocks may sometimes be executed in the reverse order, depending upon the functionality involved. In still other cases, one or more blocks may be performed in varying order with the results being stored and utilized in subsequent or other blocks that do not immediately follow.

The corresponding structures, materials, acts, and equivalents of all means or step plus function elements in the claims below are intended to include any structure, material, or act for performing the function in combination with other claimed elements as specifically claimed.

A method includes loading a first configuration bitstream into an IC, wherein the first configuration bitstream includes a first circuit design and metadata for a second circuit design. The method includes storing the metadata within a memory of the IC, detecting a configuration bitstream load condition, and, responsive to the configuration bitstream load condition, loading a second configuration bitstream into the IC. The second configuration bitstream includes the second circuit design.

Detecting the configuration bitstream load condition may include receiving a signal from the host device indicating that the host device is finished reading the metadata and, responsive to receiving the signal, requesting loading of the second configuration bitstream.

Detecting the configuration bitstream load condition may include, responsive to loading the metadata, determining that a predetermined amount of time has elapsed. Responsive to the determining, loading of the second configuration bitstream may be requested.

The method may include comparing a version of software of the second circuit design determined from the metadata and to be executed by a processor with a version of the software specified in a specification for the second circuit design. Responsive to determining that the version of the software determined from the metadata is older than the version of the software specified in the specification, a software update process may be initiated.

The method may also include preventing a host device from accessing the metadata from the memory until a valid key is received by the integrated circuit from the host device.

The metadata may include executable program code. In that case, the method may include replacing program code executable by a processor with the executable program code from the metadata. The processor may be external to the IC.

The first circuit design may implement the memory within the IC and a boot agent circuit within the IC. The boot agent circuit is configured to detect the configuration bitstream load condition and request loading of a configuration bitstream from a configuration controller of the IC. In one aspect, the first circuit design implements a memory interface configured to read the memory. In another aspect, the first circuit design utilizes the configuration controller as a memory interface configured to read the memory.

The method may also include, prior to loading the second configuration bitstream, loading at least one additional configuration bitstream including additional metadata, storing the additional metadata within the memory of the IC, and detecting a further configuration bitstream load condition causing the second configuration bitstream to be loaded.

An IC includes a memory interface and a memory coupled to the memory interface, wherein the memory stores, from a first configuration bitstream, metadata for a circuit design. The IC further includes a boot agent circuit implemented within programmable circuitry of the IC. The boot agent circuit is configured to detect a configuration bitstream load condition and, responsive to detecting the configuration bitstream load condition, initiate loading of a second configuration bitstream including the circuit design.

The boot agent circuit may notify a host device that the metadata is available responsive to loading the metadata into the memory.

In one aspect, the configuration bitstream load condition includes the boot agent circuit receiving a signal from a host device indicating that the host device is finished reading the metadata. In another aspect, the configuration bitstream load condition includes the boot agent circuit determining that a predetermined amount of time has elapsed after loading the metadata.

The IC may include an authenticator circuit coupled to the boot agent circuit. The authenticator circuit may be configured to determine whether a key provided from a host device is valid. The boot agent circuit may prevent the host device from accessing the memory until the authenticator circuit indicates the key is valid.

The IC may include a processor programmed to initiate executable operations including comparing a version of software of the second circuit design determined from the metadata and to be executed by the processor with a version of the software specified in a specification for the second circuit design and, responsive to determining that the version of the software determined from the metadata is older than the version of the software specified in the specification, initiating a software update process.

In one aspect, the memory may include a least one configuration memory cell.

A system includes a host device, a configuration device storing a first configuration bitstream and a second configuration bitstream, and an IC coupled to the host device and the configuration device. The IC includes a port, a memory storing, from the first configuration bitstream, metadata for a circuit design, and a memory interface coupled to the port and the memory. The memory interface is configured to read the metadata from the memory and provide the metadata to the port. The IC further includes a boot agent circuit implemented within programmable circuitry of the IC. The boot agent circuit is configured to detect a configuration bitstream load condition and, responsive to detecting the configuration bitstream load condition, initiate loading of the second configuration bitstream including the circuit design. The host device receives the metadata through the port.

In one aspect, the host device executes first executable program code. The metadata includes second executable program code. The host device may update the first executable program code with the second executable program code.

The features described within this disclosure may be embodied in other forms without departing from the spirit or essential attributes thereof. Accordingly, reference should be made to the following claims, rather than to the foregoing disclosure, as indicating the scope of such features and implementations.

What is claimed is:

1. A method, comprising:

implementing a first circuit design within an integrated circuit by loading a first configuration bitstream into the integrated circuit using a configuration controller of the integrated circuit;

wherein the first configuration bitstream comprises the first circuit design and metadata for a second circuit design;

wherein the first circuit design is implemented within the integrated circuit responsive to loading the first configuration bitstream with the metadata stored in a memory of the integrated circuit;

detecting, using a boot agent circuit implemented by the first circuit design, a configuration bitstream load condition indicating that the metadata is read by a host device; and responsive to the configuration bitstream load condition, implementing the second circuit design within the integrated circuit by loading a second configuration bitstream into the integrated circuit using the configuration controller;

wherein the second configuration bitstream comprises the second circuit design and is implemented within the integrated circuit responsive to loading the second configuration bitstream.

2. The method of claim 1, wherein detecting the configuration bitstream load condition comprises:

receiving a signal from the host device indicating that the host device is finished reading the metadata; and responsive to receiving the signal, requesting loading of the second configuration bitstream.

3. The method of claim 1, wherein detecting the configuration bitstream load condition comprises:

responsive to loading the metadata, determining that a predetermined amount of time has elapsed; and responsive to the determining, requesting loading of the second configuration bitstream.

4. The method of claim 1, further comprising the host device:

comparing a version of software of the second circuit design determined from the metadata and to be executed by a processor with a version of the software specified in a specification for the second circuit design; and responsive to determining that the version of the software determined from the metadata is older than the version of the software specified in the specification, initiating a software update process.

5. The method of claim 1, further comprising:

preventing the host device from accessing the metadata from the memory until a valid key is received by the integrated circuit from the host device.

6. The method of claim 1, wherein the metadata comprises executable program code, the method further comprising:

replacing program code executable by a processor with the executable program code from the metadata.

7. The method of claim 6, wherein the processor is external to the integrated circuit.

8. The method of claim 1, wherein the first circuit design implements:

the memory within the integrated circuit; and the boot agent circuit within the integrated circuit;

wherein the boot agent circuit is configured to detect the configuration bitstream load condition and request loading of a configuration bitstream from the configuration controller of the integrated circuit.

9. The method of claim 8, wherein the first circuit design implements a memory interface configured to read the memory.

10. The method of claim 8, wherein the first circuit design utilizes the configuration controller as a memory interface configured to read the memory.

11. The method of claim 1, further comprising:

prior to loading the second configuration bitstream, loading at least one additional configuration bitstream comprising additional metadata;

storing the additional metadata within the memory of the integrated circuit; and detecting a further configuration bitstream load condition causing the second configuration bitstream to be loaded.

12. An integrated circuit, comprising:

a memory interface;

a memory coupled to the memory interface;

wherein the memory stores, from a first configuration bitstream, metadata for a second circuit design;

a boot agent circuit implemented within programmable circuitry of the integrated circuit; and a configuration controller configured to implement a first circuit design within the integrated circuit by loading the first configuration bitstream therein;

wherein the first circuit design implements the boot agent circuit, the memory interface, the memory, and the metadata within the integrated circuit;

wherein the boot agent circuit is configured to detect a configuration bitstream load condition and, responsive to detecting the configuration bitstream load condition, initiate loading of a second configuration bitstream comprising a second circuit design; and wherein the configuration controller is configured to implement the second circuit design within the integrated circuit by loading the second configuration bitstream therein responsive to the load condition.

13. The integrated circuit of claim 12, wherein the boot agent circuit notifies a host device that the metadata is available responsive to loading the metadata into the memory.

14. The integrated circuit of claim 12, wherein the configuration bitstream load condition comprises the boot agent circuit receiving a signal from a host device indicating that the host device is finished reading the metadata.

15. The integrated circuit of claim 12, wherein the configuration bitstream load condition comprises the boot agent circuit determining that a predetermined amount of time has elapsed after loading the metadata.

16. The integrated circuit of claim 12, further comprising:

an authenticator circuit coupled to the boot agent circuit and configured to determine whether a key provided from a host device is valid;

wherein the boot agent circuit prevents the host device from accessing the memory until the authenticator circuit indicates the key is valid.

17. The integrated circuit of claim 12, further comprising:

a processor programmed to initiate executable operations comprising:

comparing a version of software of the second circuit design determined from the metadata and to be executed by the processor with a version of the software specified in a specification for the second circuit design; and responsive to determining that the version of the software determined from the metadata is older than the version of the software specified in the specification, initiating a software update process.

18. The integrated circuit of claim 12, wherein the memory comprises a least one configuration memory cell.

19. A system, comprising:

a host device;

a configuration device storing a first configuration bitstream and a second configuration bitstream; and an integrated circuit coupled to the host device and the configuration device, wherein the integrated circuit comprises:

a port;

a memory storing, from the first configuration bitstream, metadata for a second circuit design;

a memory interface coupled to the port and the memory;

wherein the memory interface is configured to read the metadata from the memory and provide the metadata to the port;

a boot agent circuit implemented within programmable circuitry of the integrated circuit; and a configuration controller configured to implement a first circuit design within the integrated circuit by loading the first configuration bitstream therein;

wherein the first circuit design implements the boot agent circuit, the memory interface, the memory, the port, and the metadata within the integrated circuit;

wherein the boot agent circuit is configured to detect a configuration bitstream load condition and, responsive to detecting the configuration bitstream load condition, initiate loading of the second configuration bitstream comprising the second circuit design;

wherein the host device receives the metadata through the port; and wherein the configuration controller is configured to implement the second circuit design within the integrated circuit by loading the second configuration bitstream therein responsive to the load condition.

20. The system of claim 19, wherein:

the host device executes first executable program code;

the metadata comprises second executable program code; and the host device updates the first executable program code with the second executable program code.

* * * * *